(12) United States Patent
Hass et al.

(10) Patent No.: US 9,194,039 B2
(45) Date of Patent: *Nov. 24, 2015

(54) METHOD FOR APPLYING ALUMINUM ALLOY COATINGS FOR CORROSION PROTECTION OF STEEL

(75) Inventors: Derek D. Hass, Charlottesville, VA (US); Susie Eustis, Charlottesville, VA (US)

(73) Assignee: Directed Vapor Technologies International, Charlottesville, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/421,707

(22) Filed: Mar. 15, 2012

(65) Prior Publication Data

US 2013/0202815 A1    Aug. 8, 2013

Related U.S. Application Data

(60) Provisional application No. 61/465,157, filed on Mar. 15, 2011.

(51) Int. Cl.
| | |
|---|---|
| *C23C 16/12* | (2006.01) |
| *C23C 14/24* | (2006.01) |
| *C23C 16/06* | (2006.01) |
| *C23C 14/16* | (2006.01) |
| *C23C 14/22* | (2006.01) |
| *C23C 14/30* | (2006.01) |

(52) U.S. Cl.
CPC ............... *C23C 16/06* (2013.01); *C23C 14/16* (2013.01); *C23C 14/228* (2013.01); *C23C 14/30* (2013.01)

(58) Field of Classification Search
CPC ...... C23C 16/12; C23C 14/0021; C23C 14/24
USPC .................. 427/250, 255.23, 255.31
See application file for complete search history.

(56) References Cited

U.S. PATENT DOCUMENTS

| | | | | | |
|---|---|---|---|---|---|
| 4,305,998 | A | * | 12/1981 | Manty et al. ................ | 428/661 |
| 4,963,237 | A | * | 10/1990 | Olds et al. ................... | 427/528 |
| 4,980,195 | A | * | 12/1990 | Olds ............................ | 427/528 |

(Continued)

OTHER PUBLICATIONS

Fernandes, J.C.S., et al., "Plasma-polymerised coatings used as pre-treatment for aluminum alloys". Surface and Coatings Technology 154 (2002) 8-13.*

McAlister, A.J., et al., "The (Al—Mn) Aluminum—Manganese System". Bulletin of Alloy Phase Diagrams vol. 8, No. 5, 1987, pp. 438-447.*

(Continued)

*Primary Examiner* — Bret Chen
(74) *Attorney, Agent, or Firm* — Williams Mullen PC; Bryan D. Wright

(57) ABSTRACT

Depositing pure aluminum and aluminum alloy coatings onto substrates using directed vapor deposition (DVD) method is presented herein. The aluminum alloys have decreased environmental impact both due to their composition and due to the use of DVD process with no hazardous precursors or waste. Corrosion resistance of DVD deposited aluminum and aluminum alloys is effective for protection of steel substrates. The invention includes the use of the DVD technique to apply aluminum and/or aluminum alloy coatings effective for corrosion protection; the use of plasma-activated DVD to enhance the density of aluminum and aluminum alloy coatings deposited at low substrate temperatures; the use of multi-source evaporation to control composition of aluminum alloys during DVD deposition; the application of aluminum and/or aluminum alloy coatings onto NLOS substrates can be used for corrosion protection.

6 Claims, 8 Drawing Sheets

(56) References Cited

U.S. PATENT DOCUMENTS

| | | | | |
|---|---|---|---|---|
| 5,538,078 | A * | 7/1996 | Mizuno et al. | 165/133 |
| 5,807,613 | A * | 9/1998 | Aguero et al. | 427/528 |
| 6,106,894 | A * | 8/2000 | Zapf | 427/127 |
| 6,497,920 | B1 * | 12/2002 | Pfaendtner et al. | 427/235 |
| 8,110,043 | B2 * | 2/2012 | Hass et al. | 118/715 |
| 2005/0064211 | A1 * | 3/2005 | Deavenport et al. | 428/457 |
| 2006/0255242 | A1 * | 11/2006 | Kobayashi | 250/208.1 |
| 2008/0131597 | A1 * | 6/2008 | Takehara et al. | 427/213.31 |
| 2009/0017217 | A1 * | 1/2009 | Hass et al. | 427/446 |
| 2011/0198358 | A1 * | 8/2011 | Parent et al. | 220/573.1 |
| 2011/0206844 | A1 * | 8/2011 | Wiles et al. | 427/250 |

OTHER PUBLICATIONS

Nam, Soo Woo, et al., "The Effect of Mn on the Mechanical Behavior of Al Alloys". Metals and Materials, vol. 6, No. 1, 2000, pp. 13-16.*

Talati, J.D., et al., "Aldehydes as corrosion inhibitors for aluminum—manganese alloys in potassium hydroxide". Werkstoffe und Korrosion 29, 461-468 (1978).*

Tamura, Yosuke, et al., "Liquid Solubility of Manganese and Its Influence on Grain Size of Mg—Al Alloys". Materials Transactions, vol. 47, No. 8 (2006), pp. 1968-1974.*

International Search Report and Written Opinion for PCT/US12/29288 issued Jun. 22, 2012.

* cited by examiner

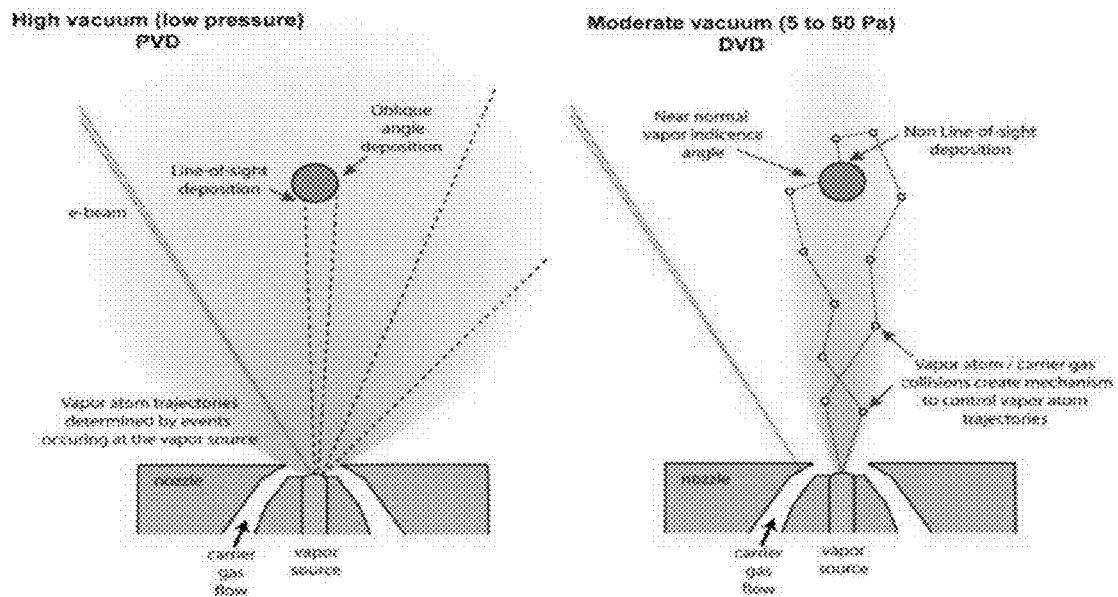
FIG. 3A                FIG. 3B
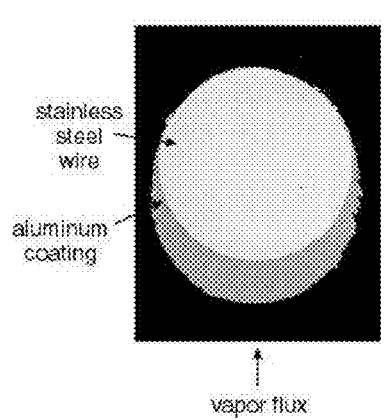    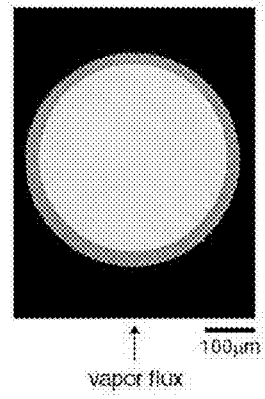
FIG. 3C                FIG. 3D

0 HRS   48 HRS   72 HRS   208 HRS   602 HRS   938 HRS   3122 HRS

METHOD FOR APPLYING ALUMINUM ALLOY COATINGS FOR CORROSION PROTECTION OF STEEL

CROSS-REFERENCE TO RELATED APPLICATIONS

The present application is based on and claims priority to U.S. Provisional Patent Application No. 61/465,157, filed Mar. 15, 2011, the disclosure of which is incorporated herein.

GOVERNMENT SUPPORT

This invention was made with Government support under N68335-06-C-0050 awarded by the Department of the Navy and FA8201-05-C-0064 awarded by the U.S. Air Force. The United States government has certain rights in the invention.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark office patent files or records, but otherwise reserves all copyright rights whatsoever.

TECHNICAL FIELD

The present invention relates generally to the field of applying thin film materials onto substrates and more specifically to the application of aluminum and/or aluminum alloy coatings for the corrosion protection of steel.

BACKGROUND

The exposure of critical equipment to salt water and the resulting corrosion is a large and costly issue. To combat corrosion, surfaces have traditionally had cadmium coatings applied to provide sacrificial galvanic protection against corrosion. Currently, cadmium coatings for critical components such as landing gear, are often vacuum deposited through a thermal evaporation physical vapor deposition (PVD) process to protect the surfaces from the corrosion environment. Unfortunately, cadmium is a hazardous substance, a known human carcinogen and extremely expensive to dispose. Thus, Executive Order 13423, Occupational Safety and Health Administration (OSHA) guidelines, and the DOD "Listing of Toxic Chemicals, Hazardous Substances, and Ozone Depleting Chemicals (Defense Standardization Program SD-14)" all require the federal government to reduce usage of this material.

Cadmium coatings provide corrosion protection for steel based components through the slightly lower electrochemical potential of cadmium, providing excellent galvanic protection to the underlying steel. This low potential difference between cadmium and high strength steel is below the critical potential for stress corrosion cracking and also does not overlap the potential range for hydrogen cracking. Replacement coatings for Cd would be required to have an electrochemical potential that is in this range. In addition to the corrosion requirements, new coating compositions would also be desired to display strong adherence to the substrate, hydrogen embrittlement resistance, no fatigue debit to the substrate, and provide impact resistance.

The constant exposure of Navy equipment to salt water insures that corrosion is a large and costly issue, estimated to cost roughly $20 billion every year. Traditionally vacuum plated cadmium is used to combat corrosion due to: the excellent galvanic protection provided to steel substrates; the good coating density; and the limited effect on the underlying substrate strength.

In general, aluminum and zinc coatings have the corrosion resistance and sacrificial properties required for many cadmium replacement applications. For high strength steel, tailhook components in particular, improved corrosion resistance over that of pure Al coatings is required. Desired properties include: slightly reduced electrochemical potential of the coating relative to the steel substrate; strong adhesion to the underlying substrate; long life of corrosion protection; and limited substrate fatigue debit caused by the coating.

It is therefore desired to incorporate alloying elements into aluminum coatings to generate coatings with the electrochemical potentials closer to that of the steel substrate. However, currently no viable deposition process exists to enable the use of aluminum alloy coatings for cadmium replacement.

To develop coating compositions and processing approaches which are environmentally friendly, but still retain the corrosion protection achievable traditionally with Cd coatings, several key issues must be kept in mind to generate successful coatings. These include: coating must be effective at protecting the substrate from corrosion and embrittlement; dense coatings to prevent attack of the substrate; able to be deposited into non line-of-sight regions of a component (e.g. the tailhook component), retain the strength of the underlying substrate after coating; and non-toxic materials for the coating composition and as precursors for processing.

Aluminum is a good material for corrosion resistant coatings due to the closeness of the electrochemical potential to steel and the properties of the aluminum oxide layer that forms on the surface upon oxygen exposure. The aluminum oxide scale is thin, slow growing (leading to enhanced stability), has good adhesion to underlying layers and forms a protective layer on the surface. This layer of aluminum oxide can be reformed if the oxide scale is removed, thus a number of existing methods have been investigated for depositing aluminum corrosion resistance coatings, each have corresponding shortcomings. Perhaps the most widely used replacement technology for cadmium corrosion resistant coatings is ion vapor deposition (IVD) of aluminum. IVD is an environmentally clean, commercially available processing approach based on physical vapor deposition (PVD), but is limited by poor coating density, long chamber pump down times and an inability to coat regions not in the line-of-sight of the vapor source. The inability to coat non line-of-sight (NLOS) areas is particularly troublesome for complex geometries such as the landing gear, and hollow fasteners with attachment holes, blind holes, concave and convex shape features. In addition, aluminum coatings deposited using the IVD technique are used in stringent corrosive environments only after additional treatments to increase the density of the coating and the application of easily damageable sacrificial topcoats. Often the modifications are through the use of chromate conversion which introduce toxic chemicals into the processing of these coatings, and are desired to be removed.

Other approaches currently being suggested to deposit corrosion resistant coatings also have limitations. For example, electroplating of aluminum such as Alumiplate has exhibited good corrosion protection, and electroplating can deposit even coatings over complex geometries, however, the electroplating of aluminum alloys is difficult since the chemistry is dependent on the continuously changing solution chemistry and the current density. Aluminum electroplating processes also require the use of toxic chemicals which can limit their application. The incorporation of hydrogen into the coating during the electroplating process can also lead to hydrogen embrittlement of the substrate unless post deposition heat treatments are applied. These additional processing steps add time and cost to the coating application process and hazardous waste continues to be an issue even with the non-Cd chemistries.

Chemical vapor deposition (CVD) and thermal spray are also under consideration for niche applications in corrosion coating deposition, but these also have many technical limitations. In CVD, coatings can be deposited onto interior surfaces because the flux is distributed across the part surface using a gas flow. However, the deposition process requires the use of toxic (and frequently expensive) precursor materials. In addition, the deposition of the multi-component metallic alloys is difficult, deposition rates are low, and high substrate temperatures are often required. Thermal spray coatings of Al and Al—Zn are used on some aircraft components as these approaches are commercially available and can coat large areas economically. However, the coatings are thick, rough and often porous limiting their effectiveness for many components, such as landing gear and fasteners.

Pure aluminum coatings have been shown to be a suitable Cd replacement in some applications, although increased performance i.e. increased protection time and less fatigue debit may be obtained through the incorporation of alloying elements to tailor the electrochemical potential closer to that of the steel substrate.

Physical vapor deposition processes such as sputtering and electron beam-physical vapor deposition (EB-PVD) typically deposit the highest quality coatings enabling thin, dense layers (under some conditions) of a wide range of coating materials. For these cases, dense layers are only obtained if depositing atoms have sufficient surface mobility to diffuse to low energy sites on the deposition surface. This can occur via thermal energy (i.e. from the heat of adsorption or from heating the substrate) or via kinetic energy (i.e. high velocity atom impacts resulting from plasma activated processes). PVD approaches are growing in interest in many applications because they do not introduce additional harmful chemicals. These processes, however, often operate under a stringent vacuum condition that increases their ultimate cost (primarily due to difficulties in achieving and maintaining ultra high vacuum) and limits their deposition to regions in the line-of-sight of the vapor source.

However, currently no viable deposition process exists to enable the use of aluminum alloys for cadmium replacement.

SUMMARY

A new and novel method to deposit pure aluminum and aluminum alloy coatings onto substrates using directed vapor deposition (DVD) method is presented herein. The aluminum alloys have decreased environmental impact both due to their composition and due to the use of DVD process with no hazardous precursors or waste. Corrosion resistance of DVD deposited aluminum and aluminum alloys is effective for protection of steel and other substrates, including for example aluminum, aluminum alloy, Titanium, Titanium alloy, copper beryllium, iron, nickel, nickel alloy, and others.

The invention includes the use of the Directed Vapor Deposition (DVD) technique to apply aluminum and/or aluminum alloy coatings effective for corrosion protection; the use of plasma-activated DVD to enhance the density of aluminum and aluminum alloy coatings deposited at low substrate temperatures; the use of multi-source evaporation to control composition of aluminum alloys during DVD deposition; the application of aluminum and/or aluminum alloy coatings onto complex substrates shapes having regions that are not in the line-of-sight of the vapor source; and aluminum alloy compositions of above Al-0.1% Mn to Al-50% Mn (wt %) can be used for corrosion protection, particularly including Al-3% Mn to Al-47% Mn (wt %), especially including AL-7% Mn (wt %) to Al-25 Mn (wt %).

Advanced vapor deposition approaches that facilitate non line-of-sight deposition to enable internal regions of components to be coated, allow flexible control of the coating composition and microstructure to enable dense coatings of a wide range of materials.

BRIEF DESCRIPTION OF THE DRAWINGS

FIG. 3A-3D illustrate representations of the source vapor expansion with FIG. 3A no carrier gas flow, the source vapor cloud expands and no non line-of-sight deposition is achieved, FIG. 3B with carrier gas flow, the source vapor cloud is contained through collisions with the carrier gas and non line-of-sight deposition is achieved through altering the trajectory of the vapor molecules, FIG. 3C cross-section of a fiber coated with no carrier gas flow and FIG. 3D cross-section of a fiber coated with DVD and an optimized carrier gas flow to achieve significant non line-of-sight coating;

DETAILED DESCRIPTION OF PREFERRED EMBODIMENTS

Figure 1:
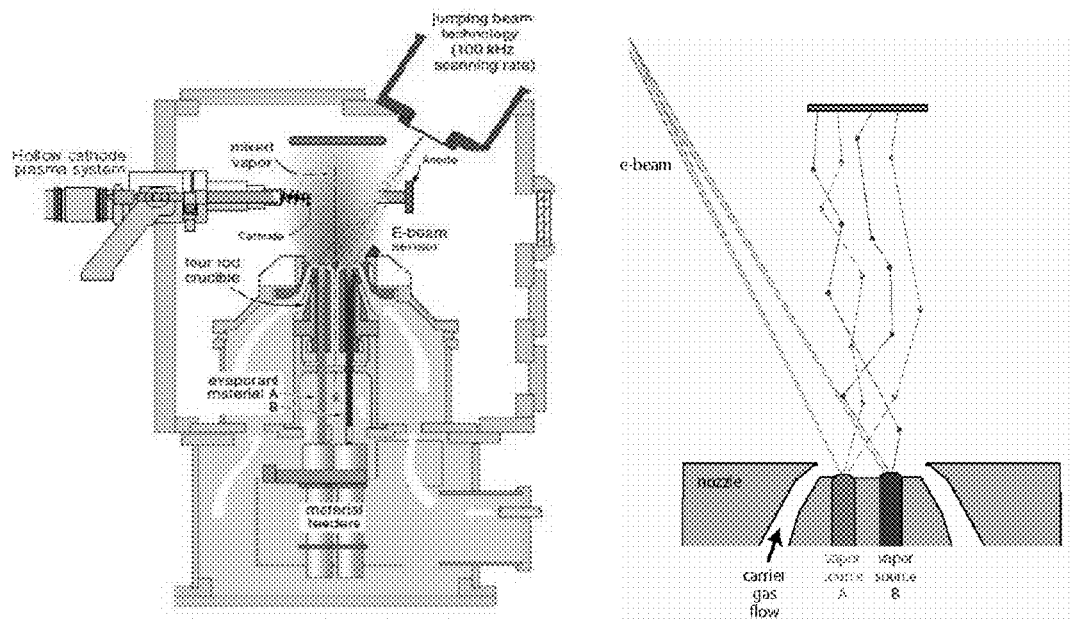
FIG. 1 illustrates a schematic representation showing the DVD coating showing multisource capability and plasma activation.

Exemplary embodiments describe a coating and coating process where neither the coating itself nor the coating process is harmful to the environment or people. The coating also functions to protect the substrate from corrosion. To fully protect the substrate, the coating should have an electrochemical potential slightly less than that of the base substrate to allow for sacrificial galvanic corrosion protection. In addition, the coating must also have excellent adhesion to the substrate to insure that the coating remains intact during operation. A list of the requirements for both the coating and the coating process is given in Table 1 for a non-toxic replacement of a cadmium corrosion coating. It can be seen from Table 1 that selection of a material which is not only able to protect the substrate from corrosion, but to do so without reducing the strength of the substrate is imperative for components on aircraft.

TABLE 1

Requirements for coating and coating process for high corrosion resistance and non-toxic coatings and processes.
Requirements

| For Coating | For Coating Process |
| --- | --- |
| Dense | Able to coat non line-of-sight components |
| Electrochemical potential slightly below substrate | Apply coating at temperature below exposure limit of substrate |
| Crack free | Fast |
| Good impact resistance | Efficient |
| Good adhesion | Deposit desired adhesion |
| No fatigue debit | Deposit desired chemistry |
| Provide good corrosion resistance | Deposit desired microstructure |
| Non-toxic | Non-toxic for all processes |

The predominance of aluminum coatings as replacement for cadmium corrosion coatings suggests aluminum as a good base material for corrosion resistant, non-toxic coatings. Aluminum is not a hazardous material and is capable of providing protection from corrosion through the formation of a barrier oxide layer. However, the desire to remove the post-coating processing steps, which often involve toxic chemicals or leads to hydrogen embrittlement of the substrate leads to the desire to deposit aluminum alloys. Aluminum alloys have the ability to enhance the properties of the coating to increase the corrosion resistance.

Non-toxic processing: Many of the alternatives to Cd corrosion resistant coatings are non-toxic coatings, such as aluminum coatings. However, many of the processes require toxic chemical as part of the coating process, such as electroplating solutions with cyanide or other hazardous chemical or hexavalent chromium which is used for chromium conversion to improve the corrosion resistance of IVD deposited aluminum. Thus, it is important to consider not only the chemical make up the coating itself but also the coating process.

Since Directed Vapor Deposition is based on physical vapor deposition, where solid rods of the desired source material are evaporated into the vapor phase, there are no solutions that need to be disposed of, and the starting material is the same composition as the coating composition. Thus, using non-toxic coating materials provides a non-toxic DVD process.

Processing Parameters:

Directed vapor deposition can be used to deposit aluminum alloy coatings through use of either a single source if desired compositions can be achieved, or through multisource evaporation. Multi-source evaporation in DVD is enabled by the use of advanced e-beam gun technology having high speed e-beam scanning (up to 100 kHz). This allows multiple crucibles placed in close proximity to one another to be precisely heated and the source material evaporated. The carrier gas surrounds the vapor sources and allows the vapor from the neighboring melt pools to interdiffuse. By altering the electron beam scan pattern to change the temperature (and thus the evaporation rate) of each source material the composition of the deposited layer can then be controlled. In effect this is a splitting of the beam into two or more beams with precisely controllable power densities, as illustrated in FIG. 1B. As a result, the DVD system enables the evaporation of several materials simultaneously. Carrier gas conditions have been identified that lead to very good mixing between the vapor fluxes of the different melt pools leading to a uniform coating composition across the substrate. This intermixing is due to the closely spaced melt pools and vapor phase collisions that allow lateral diffusion of vapor atoms. A schematic diagram of the directed vapor deposition process is shown in FIG. 1A with carrier gas, material feeds, multiple source capability, plasma enhancement, substrate bias, and high speed scanning electron beam source. The DVD coating system of FIG. 1 is similar to other DVD coating systems, but deposits aluminum or aluminum alloy in a non-toxic technique.

The ability of the coating technique to deposit a dense layer: Creating dense layers can vastly improve the performance of corrosion resistant coatings, through the reduction in vacancy sites that are available for attack.

Figure 2:
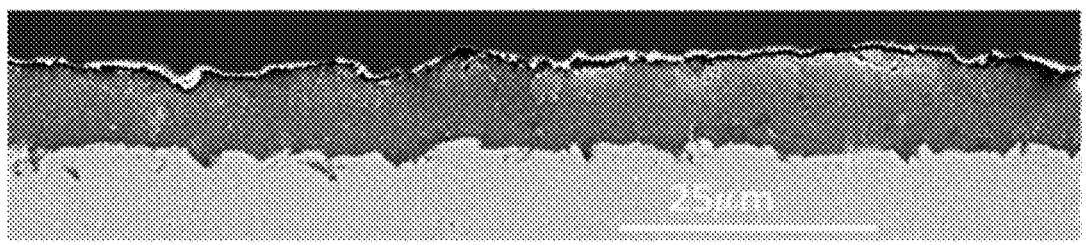
FIG. 2 provides a magnified image of aluminum coating deposited dense with the DVD process at 260° C. using primarily Al.

The mobility of the deposited vapor atoms determines the microstructure of deposited coatings. Increasing the substrate temperature during coating deposition closer to the melting temperature of the vapor species will increase the mobility, and thus the density of the coating. Aluminum is a material with a relatively low melting temperature, thus substrate temperatures between 150-350° C. can be used to deposit dense coatings. FIG. 2 illustrates an electron microscope image of a cross section of the aluminum coating deposit with a dense DVD process at an approximate temperature of 260° C. Visible in the cross-section image is the dimension of 25 microns.

As noted above, one embodiment utilizes the substrate temperature to be between 150-350° C., but it is recognized that this range is exemplary in nature only. The varying types of substrates provide for varying temperature ranges, ranges from room temperature to an approximate melting point for the substrate. In various embodiments, substrates can be any number of possible compositions, including but not limited to steel, aluminum, aluminum alloy, titanium, titanium alloy, copper beryllium, iron, nickel, and nickel alloy. Thus, operating temperature ranges can vary from room temperature to corresponding melting points and adjusted as per any number of deposition factors.

Alloy additions will affect the melting temperature, and thus the density of a deposited coating at a given temperature. Both the species and the concentration of alloy elements will affect the increase in melting temperature, while some alloys, such as those with only small additions of alloying elements or additions of other low melting temperature elements such as Zn will still have dense microstructures at the same temperature as bulk aluminum, 150-350° C., wherein effective deposition is visible in the cross-section of FIG. 2.

Figure 8A:
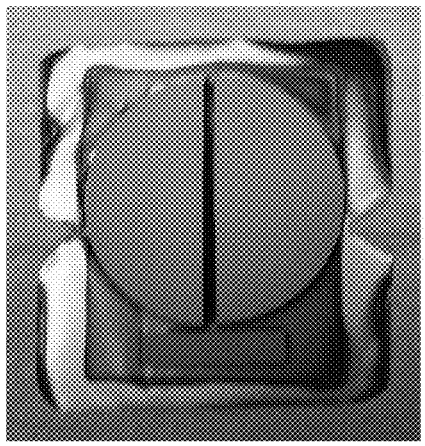
FIG. 8A illustrates an image of Al—Mn coating.
Figure 8B:
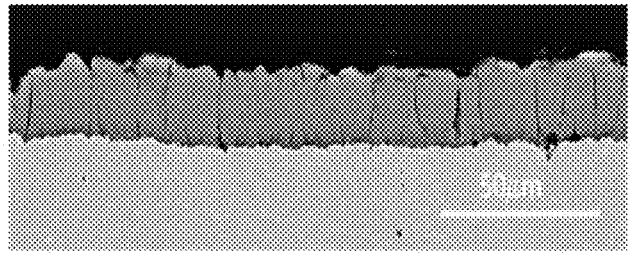
FIGS. 8B-8C illustrate magnified images of DVD deposited Al—Mn coatings both without (FIG. 8B) and with (FIG. 8C) plasma activation.
Figure 8C:
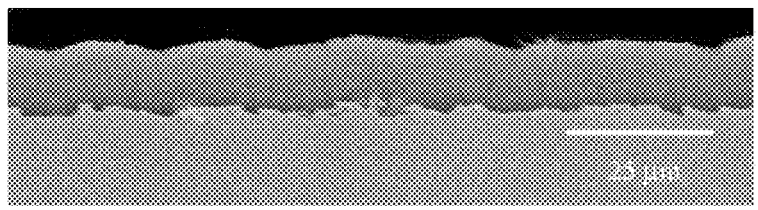

Plasma activation is another technique used with the directed vapor deposition approach to increase the density of coatings while maintaining low substrate temperatures. Plasma-activation in DVD is performed by a hollow-cathode plasma unit capable of producing a high-density plasma in the system's gas and vapor stream. The plasma generates ions that can be accelerated towards the coating surface by either a self-bias or by an applied electrical potential. Increasing the velocity (and thus the kinetic energy) of ions by using an applied potential allows the energy of depositing atoms to be varied, affecting the atomic structure of coatings. Thus dense coatings can be applied with lower substrate temperatures than with convention heating alone. FIG. 8B shows an aluminum-manganese coating applied at 250° C. using the directed vapor deposition method, while FIG. 8C shows deposition of the aluminum-manganese coating at the same temperature with plasma enhanced directed vapor deposition, in this embodiment using a plasma current of 60 A and a substrate bias of −200V DC. This allows lower deposition temperatures to generate fully dense coatings.

An important parameter in applying corrosion resistant coating to components, such as landing gear components and hollow fasteners, is the ability of the deposition technique to deposit uniform coatings of the desired composition onto all areas of the component including NLOS areas. Directed vapor deposition is able to deposit coatings into non line-of-sight regions through the multiple collisions of the source vapor with the carrier gas during the travel from the source to the substrate. The collisions not only alter the spread of the vapor as it approaches the substrate, but also change the trajectory of the individual vapor molecules allowing the vapor to deposit onto non line-of-sight regions of substrates with incident angles close to the substrate normal.

FIG. 3A illustrates the prior art high vacuum, low pressure PVD approach for coating. As visible in FIG. 3A, there is a lack of deposition on non-line-of-sight regions. For further illustration of the shortcomings of the PVD approach, FIG. 3C illustrates the aluminum coating on a steel wire, having all deposition on the lower region and no deposition on the NLOS region.

By contrast, FIG. 3B illustrates a moderate vacuum DVD that includes the ability for NLOS deposition. In this example, the vacuum is between 5 and 50 Pa and the illustrations in FIG. 3B provide how molecular interaction allows for the NLOS deposition.

When the carrier gas is used with optimized conditions, a non-rotating fiber can be coated where the thickness of the coating on the opposite side is approximately 70% the thickness of the coating achieved closest to the source, FIG. 3D. Thus, significant coatings can be deposited onto non line-of-sight areas through optimization of the carrier gas pressure to influence the number of collisions that the vapor experiences with the carrier gas between the source and the substrate.

Figure 4A:
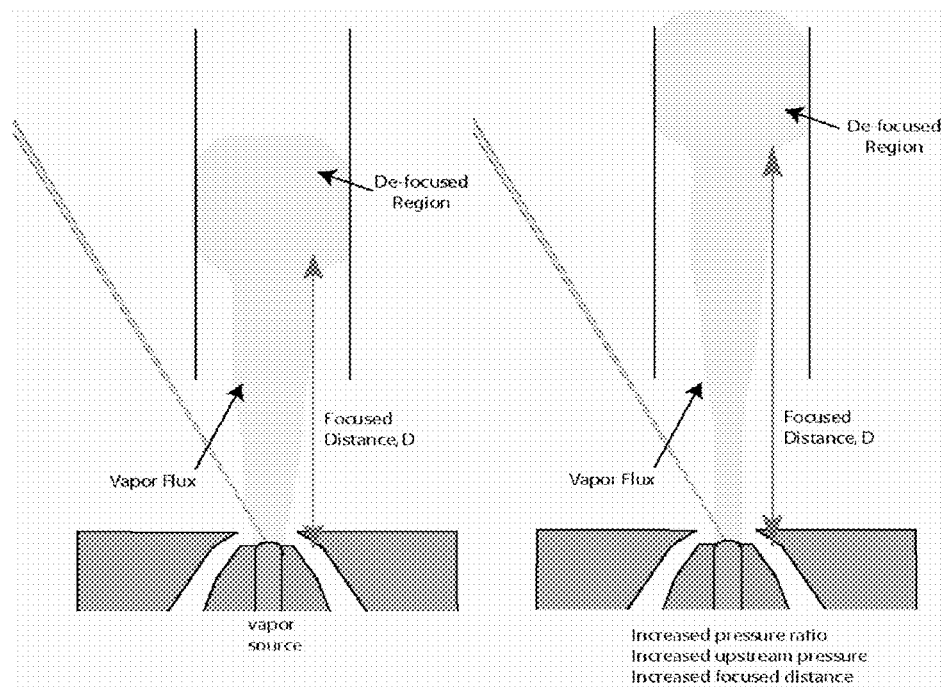
FIG. 4A illustrates a schematic diagram of the focusing and defocusing of the directed vapor deposition approach to infiltrate vapor into hollow tubes.
Figure 4B:
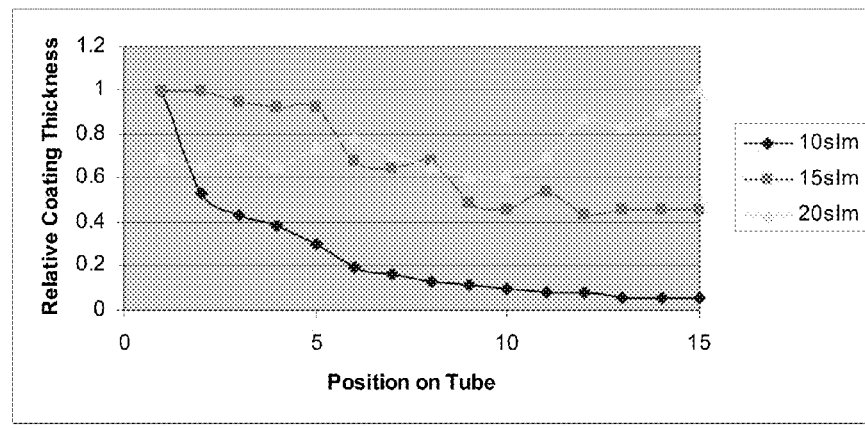
FIG. 4B illustrates a graph of the relative thickness of aluminum coating with different carrier gas rates (10, 15, and 20 slm) showing the different thickness deposition profiles of the different gas conditions.

Other non line-of-sight structures such as the interior of landing gear tubes can be coated using the directed vapor deposition technique. The carrier gas is used to first collimate the source vapor and infuse the inner tube diameter, allowing the source vapor to reach the desired structure. Then the vapor is defocused to allow deposition onto the desired region, as illustrated FIG. 4. Changing the carrier gas flow, carrier gas rate, pressure ratio, chamber pressure, tube diameter, or nozzle geometry will lead to a different defocusing distance. Thus, by changing the pressure ratio during the deposition, a tube can be coated with uniform coating throughout the entire thickness. A graph of the profile of the relative thickness of deposited coatings with different carrier gas flows are shown in FIG. 4B.

Figure 5A:
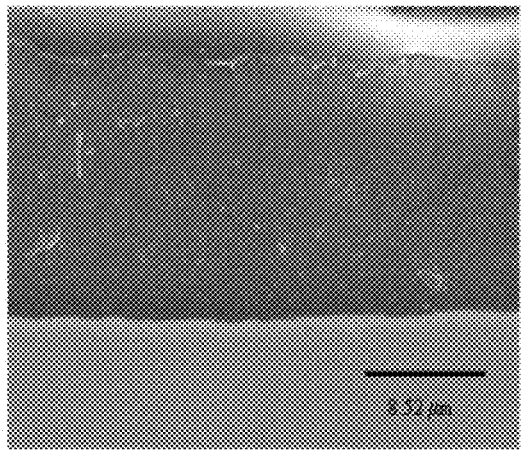
FIGS. 5A-5B illustrate magnified images of aluminum coating deposited at different carrier gas rates showing fully dense coatings was not dependant on the carrier gas flow. Carrier gas flow, FIG. 5A at 10 slm and FIG. 5B at 20 slm.
Figure 5B:
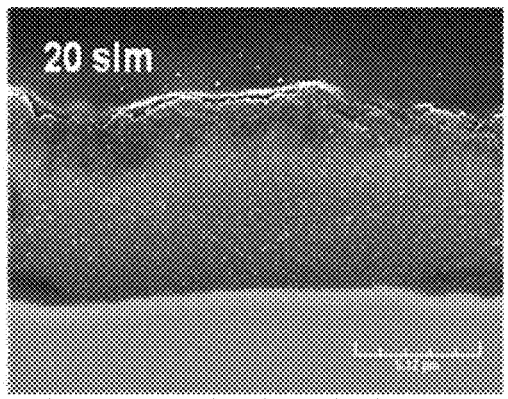

The microstructure of the coatings deposited at different carrier gas flows are shown in FIGS. 5A-B. FIG. 5A shows dense aluminum coatings with low carrier gas flow, in this embodiment at 10 slm. FIG. 5B shows the dense aluminum coatings with a high carrier gas flow, in this embodiment at 20 slm. In the exemplary embodiments illustrated in FIGS. 5A-5B, these coatings were deposited at 200° C.

There are a number of potential applications for the deposition of these aluminum alloy coatings for corrosion protection. Some examples include landing gear components for air craft, fasteners, bolts (including hollow bolts) and electrical connectors. Landing gear components of special interest include the tailhook found on military aircraft to allow landings on short runways such as those found on air craft carriers. Components of interest on the tailhook include the hookpoint, attachment point, and shaft connecting the hookpoint to the aircraft.

Fasteners and bolts made out of steel, particularly high strength steel, or aluminum are also good candidates for these aluminum alloy coatings. Hollow bolts are of particular interest with their non-line of sight regions. Other likely installations include components for buildings near the ocean, docks and other maritime structures, boats, ships, ocean fairing craft, and offshore installations such as windmills or oil drilling rigs and their supporting structure. Also of interest are components which require both a wear coating and a corrosion coating such as landing gear or attachment hardware.

Aluminum Alloy Compositions of Interest: Al—Mn alloys which were previously demonstrated by the Navy to be effective for galvanic protection applications. Such systems were previously produced using an electroplating process that was deemed too toxic for use. For this case, the unique combination of a NLOS vapor deposition processing approach and a potentially effective coating composition were tested.

Earlier efforts identified aluminum manganese alloys as of potential interest for corrosion resistance of steel and ferrous substrates. The majority of focus of earlier efforts were with Mn 16-30% (wt %), using electrodeposition. This work focused on higher Mn content (30-40% wt %), and thus are not obvious from previous studies as highly preventative against corrosion attack.

Figure 6:
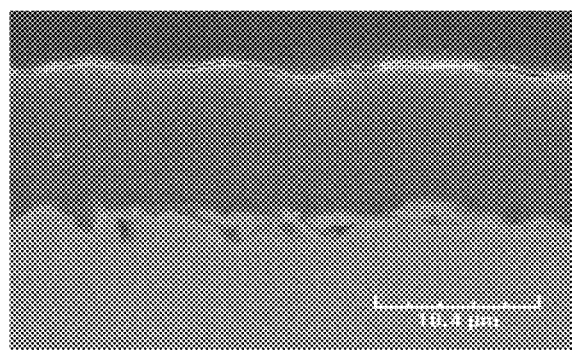
FIG. 6 illustrates a magnified image of a dense aluminum alloy coating deposited using DVD on a steel substrate.

Al—Zn—Sn alloys can also be used to further optimize the corrosion protection offered by aluminum for landing gear applications. In this case, a multi-source electron beam evaporation approach was used in conjunction with a carrier gas jet to obtain samples with multiple compositions that could be rapidly screened to obtain compositions with desired electrochemical potential and corrosion resistance. The target composition was 75% Al-24% Zn-1% Sn (wt %). Separate sources of aluminum, zinc and tin were co-evaporated in the desired ratio to create the alloy coatings. The coating adhesion appeared to be good across the entire substrate surface, as represented in the cross-section illustration of FIG. 6. The coatings deposited using DVD were dense coatings, with no indications of porosity. The coated substrates were sectioned and selected regions of the substrates were exposed to corrosion potential and B117 salt fog testing. The corrosion potential of the Al—Zn—Sn alloys ranged from 0.71-0.74 V (i.e. closer to that of the steel substrate than Cd which is typically ~0.8 V). No Red Rust (RR) was observed on the surfaces of any control and DVD processed Al—Zn—Sn alloys after 336 hours of testing.

TABLE 1

Examples of Aluminum Alloys that have been deposited with the Directed Vapor Deposition Method to Provide Corrosion Protection. Compositions Selected for Deposition

| Aluminum Alloys (all are given in wt %) | Al coatings are non-toxic Alloy can be used to tune galvanic potential closer to Cd than pure Al Can deposit alloy compositions with DVD processing |
|---|---|
| Al—Zn—Sn | Showed good galvanic potential |
| Al—Mn | Good results previously from the Navy |
| Aluminum Glass | Aluminum Glasses—may resist pitting Less toxic or costly alloys selected |

Deposition Conditions: Some deposition conditions are listed in Table 3, aluminum alloys deposited with the directed vapor deposition method, by way of example. Deposition conditions of interest for depositing aluminum alloy coatings for corrosion applications include heating of the substrate from temperatures between 100-1000° C., with the preferred temperature range dependent on the substrate and coating composition. One range of particular interest is 180-320° C. where low temperature materials are stable, will form dense layers, and below the temper of many high strength steels substrates.

The thickness of the deposited films is desired to be in the range of 2-50 μm thick. More specifically the thickness of the films is desired to be in the range of 10-20 μm thick.

The coating is desired to be fully dense to provide corrosion resistance. High coating density can be achieved through increase of the deposition temperature, or use of a plasma activation system with an applied substrate bias. Plasma currents of 0-150 A can be used, and substrates bias between 0 to −250 V DC can be used, with a preferred range of −175 to −225 V DC.

The pressure ratio (ratio of the carrier gas to the chamber pressure) can be used to deposit coatings onto the region of interest, increase deposition rate, increase deposition efficiency. Pressure ratios between 1-500 are of interest. Ratios between 5-10 are of high interest. Pressure ratios may be varied during coating deposition to vary the distribution profile of the source material onto the substrate or component of interest. Typical operating pressures are approximately in the 1 to 50 pa range (i.e. about $7.5 \times 10^{-3}$ to 0.375 torr), but may also include the range of about $10^{-4}$ to about $10^3$ torr. Other alternative ranges include, but not limited thereto, the following: about $10^{-3}$ to about $10^2$ torr, about $10^{-2}$ to about 10 torr, about 0.1 torr to about 1 torr, about 0.05 to about 0.5 torr, to about 0.025 torr to about 0.3 torr. It should be appreciated that the operating pressures may be less than $10^{-4}$ or greater than $10^3$ torr.

Substrates requiring protection that could be protected by the details described herein include but are not limited to, steel, particularly high strength steel, and low strength steel, aluminum substrates and titanium based substrates.

TABLE 2

Deposition Parameters for some Al Alloy coatings deposited with Directed Vapor Deposition

| Run Code | Source Composition (wt %) | S1 feed rate (mm/min) | carrier gas | Carrier gas flow | Pressure Ratio* | Max Temperature (C.) | Beam Power |
|---|---|---|---|---|---|---|---|
| NCR-7 | Al—13% Mn | 0.20 | He | 5 | 9.45 | 238 | 40 |
| NCR-8 | Al—10.5% Fe—23.5% Y | 0.25 | He | 5 | 10.00 | 262 | 40 |
| NCR-11 | Al—10.5% Fe—23.5% Y | 0.20 | He | 5 | 10.28 | 262 | 28 |
| NRC-12 | Al—13% Mn | 0.09 | He | 5 | 9.33 | 247 | 40 |
| NRC-13 | Al—10.5% Fe—23.5% Y | 0.35 | He | 5 | 9.47 | 254 | 28 |
| NRC-14 | Al—24% Zn—1% Sn | 0.08 | He | 5 | 9.09 | 259 | 40 |
| NCR-17 | Al—13% Mn | 0.08 | He | 5 | 6.92 | 257 | 40 |
| NCR-18 | Al—10.5% Fe—23.5% Y | 0.35 | Ar | 3 | 10.52 | 272 | 28 |
| NCR-19 | Al—13% Mn | 0.10 | He | 5 | 7.20 | 264 | 41 |
| NCR-21 | Al—24% Zn—1% Sn + Zn | 0.08 | He | 5 | 5.42 | 264 | 40 + 12 |
| NCR-22 | Al—24% Zn—1% Sn + Zn | 0.08 | He | 5 | 5.84 | 273 | 41 + 12 |
| NCR-23 | Al—13% Mn | 0.05 | Ar | 3 | 12.09 | 298 | 52 |
| NRC-24 | Al—5.9% Fe—33% Y | 0.24 | He | 5 | 6.9 | 277 | 28 |
| NCR-27 | Al—13% Mn | 0.03 | He | 7 | 6.3 | 253 | 45 |
| NCR-28 | Al—13% Mn | 0.04 | He | 3 | 7.0 | 257 | 52 |
| NCR-29 | Al—13% Mn | 0.00 | He | 11 | 5.7 | 257 | 64 |
| NCR-30 | Al—13% Mn | 0.10 | He | 3 | 7.2 | 293 | 55 |
| NCR-31 | Al—13% Mn | 0.10 | He | 11 | 7.3 | 299 | 60 |
| NCR-32 | Al—13% Mn | 0.10 | Ar | 3 | 10.6 | 270 | 60 |
| NCR-33 | Al—13% Mn | 0.11 | Ar | 5 | 10.8 | 267 | 65 |
| NCR-34 | Al—13% Mn | 0.06 | Ar | 5 | 10.8 | 265 | 70 |
| NCR-35 | Al—13% Mn | 0.10 | Ar | 3 | 9.3 | 255 | 60 |
| NCR-39 | Al—13% Mn | 0.09 | He | 5 | 7.5 | 254 | 40 |
| NCR-40 | Al—13% Mn | 0.03 | He | 5 | 8.1 | 250 | 70 |
| NCR-41 | Al—13% Mn | 0.12 | He | 5 | 8.2 | 272 | 70 |
| NCR-42 | Al—13% Mn | 0.13 | He | 5 | 7.9 | 257 | 60-70 |
| NCR-43 | Al—13% Mn | 0.08 | Ar | 3 | 12.0 | 291 | 65-75 |
| NCR-44 | Al—13% Mn | 0.06 | Ar | 5 | 11.7 | 271 | 85 |

| Run Code | plamsa? | Thickness - calc (um) | Thickness - Measured (um) | Composition Measured (wt %) | depsoition rate (um/min) |
|---|---|---|---|---|---|
| NCR-7 | no | 0.96 | | | |
| NCR-8 | no | 8.41 | | | |
| NCR-11 | no | 6.04 | | | |
| NRC-12 | no | 13.20 | 17.68 | Al—32.2% Mn | 0.29 |
| NRC-13 | no | 14.19 | 18.22 | Al—18.8% Fe—14.7% Y | 1.82 |

TABLE 2-continued

Deposition Parameters for some Al Alloy coatings deposited with Directed Vapor Deposition

| | | | | | |
|---|---|---|---|---|---|
| NRC-14 | no | 4.62 | 10.16 | Al—0.7% Zn—3.3% Sn | 0.41 |
| NCR-17 | no | 6.28 | | | |
| NCR-18 | no | 2.80 | 2.93 | | 0.59 |
| NCR-19 | no | 6.49 | 4.41 | Al—35.5% Mn | 0.15 |
| NCR-21 | no | 0.26 | | | |
| NCR-22 | no | 7.36 | 8.4 | | |
| NCR-23 | yes | 13.41 | 9.2 | Al—18.6% Mn | 0.31 |
| NRC-24 | No | 2.61 | | Al—11.3% Fe—14.3% Y | |
| NCR-27 | No | 5.18 | | | |
| NCR-28 | No | 3.48 | | | |
| NCR-29 | No | 7.18 | | | |
| NCR-30 | 60 A | 0.48 | | | |
| NCR-31 | 60 A | 2.79 | | | |
| NCR-32 | 60 A | 2.22 | | | |
| NCR-33 | 60 A | 2.44 | | | |
| NCR-34 | 60 A | 2.05 | | | |
| NCR-35 | no plasma | 5.57 | | | |
| NCR-39 | no plasma | −0.87 | | | |
| NCR-40 | no plasma | 9.67 | | | |
| NCR-41 | no plasma | 14.28 | | | |
| NCR-42 | no plasma | 14.15 | | | |
| NCR-43 | no plasma | 36.44 | | | |
| NCR-44 | no plasma | 26.08 | | | |

Additionally, the corrosion resistance of the coating can be improved through a number of different methods, including shot peening to increase the coating density or a chromate conversion.

Further supporting the invention for proper deposition of aluminum and/or aluminum alloy is electrochemical testing. Reference samples and DVD coated samples have been analyzed for their electrochemical potential. Both uncoated 4330V steel and bare Al foil substrates were measured for comparison. Steel substrate (4330V) coated with the compositions described in Table 4 in addition to a reference Cd coating were measured to determine the how the electrochemical potential of the aluminum alloys compares to the currently used Cd coating.

Figure 7:
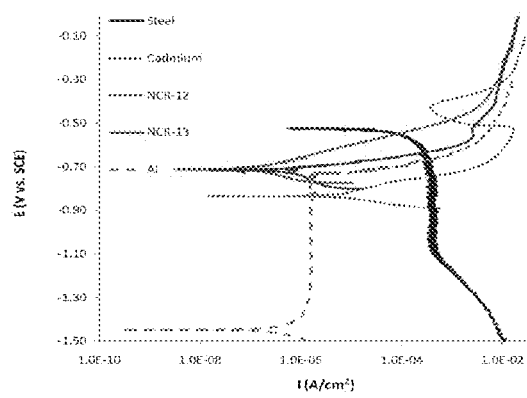
FIG. 7 illustrates a PDS scans for coatings and substrates of interest compared to 4330V steel. NCR-12, an Al—Mn coating and NCR-13, an Al—Fe—Y glass former.

Full cathodic/anodic potentiodynamic (PDS) scans on the cadmium and aluminum alloy-coated coupons were performed using a three electrode flat cell technique with a saturated calomel electrode (SCE) as reference. The tests were performed using air-equilibrated 5% NaCl electrolyte and a scan rate of 0.2 mV/sec from −0.10V vs. $E_{OCP}$ to +1.00V $E_{OCP}$. A cathodic scan was performed on the base 4330V steel in 5% NaCl with bubbled $O_2$ using a scan rate of 0.2 mV/sec from 0V vs. $E_{OCP}$ to −1.00V vs. $E_{OCP}$. The results of the PDS scan are shown in FIG. 7, where two DVD aluminum alloy coatings are shown along with the uncoated steel substrate, cadmium coated substrate and pure Al foil substrate. NCR-12 is an Al—Mn alloy coating, and NCR-13 is an aluminum glass former of Al—Fe—Y. The open circuit potential ($E_{OCP}$), corrosion current ($I_{CORR}$), galvanic corrosion potential ($E_{int}$), and the galvanic current ($I_{int}$) for the coatings and substrates tested are listed in Table 4.

TABLE 3

Electrochemical data taken from the PDS scans shown in FIG. 7.

| Sample | $E_{OCP}$ (V vs. SCE) | $I_{CORR}$ (A/cm$^2$) | $E_{int}$ (V vs. SCE) | $I_{int}$ (mA/cm$^2$) |
|---|---|---|---|---|
| Cadmium | −0.833 | 4.634 | −0.742 | −0.392 |
| NCR-12 Al—Mn | −0.711 | 0.139 | −0.549 | 0.086 |
| NCR-13 Al—Y—Fe | −0.715 | 0.452 | −0.632 | 0.295 |
| Pure Al | −1.447 | 0.366 | −0.668 | −0.325 |

As can be seen in the Table 4 and FIG. 7, the $I_{CORR}$ values for NCR-12 and NCR-13 are substantially lower than the value for cadmium (one order of magnitude lower vs. 4.634 µA/cm$^2$ for cadmium). This is expected to translate into a lower free-corrosion rate when comparing the coatings on a given part in the field or operational environment. In other words, if the coated part is undamaged, the aluminum alloys should corrode via free-corrosion at a slower rate relative to the cadmium.

The open circuit potential of NCR-12 and NCR-13 (−0.711 and −0.715 V, respectively) are slightly more positive than cadmium, which should be desirable for corrosion protection coatings.

When the coating is scratched and the underlying steel substrate is exposed, the $I_{int}$ values (or galvanic current, marked by the intersection of the coating and steel curves) indicate a slightly lower corrosion rate for the NCR-13 coating as compared to the cadmium, with the lowest value being exhibited by NCR-12, the Al—Mn coating (0.086 mA/cm$^2$ vs 0.392 mA/cm$^2$ for Cd—an order of magnitude lower). The galvanic corrosion potentials ($E_{int}$) of the aluminum alloy coatings are very similar to that of cadmium.

SEM and EDS analysis of the samples was performed to determine coating microstructure and composition. A fully dense coating was deposited using plasma activation for the Al—Mn system as shown in FIG. 8. FIG. 8A illustrates an Al—Mn coating, while FIGS. 8B and 8C illustrate cross-sections at 50 microns and 25 microns to better illustrate the density of the coating. The use of plasma activation was found to generate a dense coating. The composition of coating NCR-19 was found to be Al-35.5% Mn, similar to the composition of the previous coating, NCR-12 (Al-32.3% Mn) deposited with similar deposition conditions.

Salt Fog Testing: Two types of testing were completed: Scribed and unscribed salt fog testing in accordance with ASTM B117. DVD deposited aluminum alloy samples and a reference vacuum plated cadmium sample for salt fog testing were all prepared in the same manner. Scribes were made using a standard scribe tool in either an "X" configuration on flat disc samples such that the lines crossed in the center of the sample face and ran to within approximately ⅛" of the edges. "V" scribes were made on the flat half-disc samples in the same manner. The back (bare steel) and edges were coated with a spray-applied corrosion resistant primer using a Badger 200NH airbrush sprayer. The edges and back were coated to prevent premature failure of samples due to corrosion of uncoated areas. The primer was Deft 02-GN-084 which conforms to MIL-PRF-23377J, Type I, Class N. Primed samples were allowed to dry for a minimum of 24 hours before being handled. Once dry, the samples were adhered to polymer sheets using double sided tape and placed at an angle slightly off vertical using a salt fog chamber coupon rack.

Figure 9:
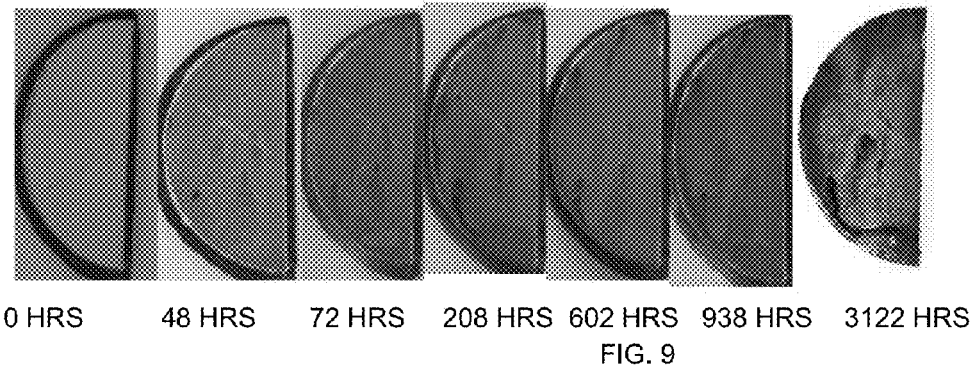
FIG. 9 provides images of sample NCR-12 (scribed), an Al—Mn alloy after salt fog testing. This coated substrate exhibited only minimal red rust after the entire time tested (3,122 hours)
Figure 10:
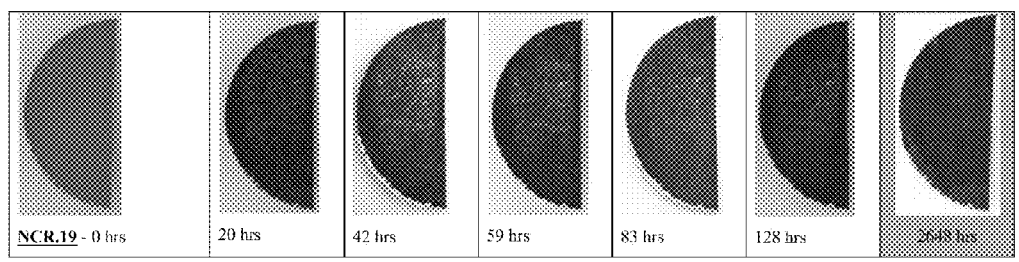
FIG. 10 provides images of sample NCR-19, an Al—Mn alloy after salt fog testing.
Figure 11:
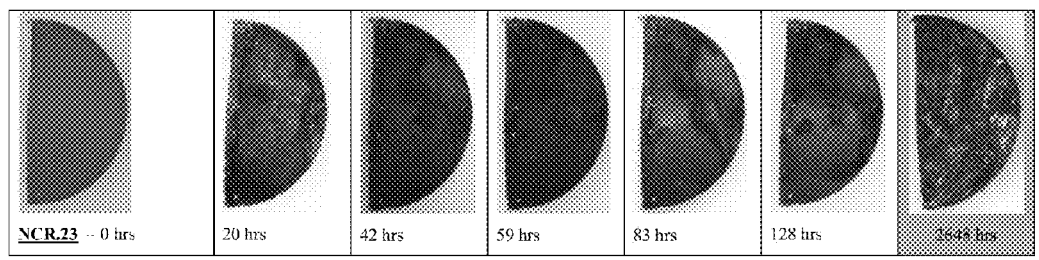
FIG. 11 provides images of sample NCR-23, an Al—Mn alloy after salt fog testing.

The performance of the deposited coating in salt fog testing was recorded (B117 testing spec). FIG. 9 provides testing results showing that sample NCR-12 survived over 3,000 hours in the scribed condition with only minimal formation of rust. In the first 24 hours, staining in the scribe mark appeared. As the time in salt fog chamber increased, slightly more locations of discoloration are observed. The electrochemical data from this sample suggested that the coating was a good potential replacement for Cd due to the very low galvanic current and the low free corrosion rate. FIG. 10 provides testing results showing that coating NCR-19 also appeared to survive the salt fog condition for more than 2,500 hours with very minimal rust formation. The performance of the plasma activated coating (NCR-23) in salt fog testing was not equal to that of the other Al—Mn coatings, as noted in FIG. 11, providing that higher concentrations of Mn lead to better resistance to corrosion.

Thus, this DVD deposited Al—Mn coating is anticipated to be effective in providing corrosion resistance to substrates such as steel. The Al—Mn chemistry was based on previous research by the Navy, which was able to deposit an Al-13% Mn (wt %) coating using electrochemical deposition which were shown to have good corrosion protection for steel substrates. However, challenges were encountered in attempts to deposit the Al—Mn coating in a method that was consistent with environmental processing concerns due to the release of visible emissions during the coating set-up and processing. Thus, combining this Al—Mn chemistry which forms good corrosion protection coatings, with the Directed Vapor Deposition (DVD) processing approach generates corrosion coatings with the desired corrosion protection and the removal of environmentally hazardous materials from both the coating and the deposition approach. In one embodiment, good corrosion protection was determined with a coating composition of Al-23% Mn (wt %), while previous research by the Navy identified the best performing composition around Al-13% Mn (wt %).

Figure 12A:
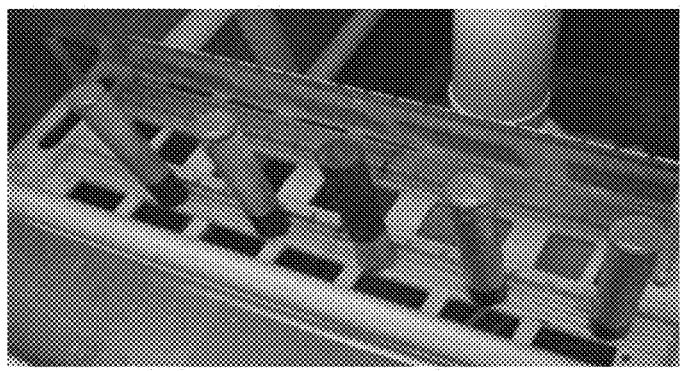
FIG. 12A is an image of coated test bars for a B117 salt fog test prior to testing.

A standardized laboratory corrosion test was conducted of the aluminum coatings in accordance with the procedures and testing protocols referenced in American Society for Testing and Materials (ASTM) specification B117. For this test, test bars were processed with an "as-deposited" thickness of 0.0003 inches (0.3 mils) FIG. 12A illustrates the bar prior to the testing. The failure criterion for all test bars in the chamber was the first evidence of red rust on the surfaces of the bars. Three separate sets of 300M steel test bars were exposed within the corrosive laboratory test environments. One set (a single bar) was uncoated and considered the baseline control (this bar began to severely oxidize immediately and red rust formed on all surfaces within the first 4 hours of exposure). A second set of three "control" bars was coated with electrodeposited cadmium by Holman Plating in Dayton, Ohio. Two of the bars were unscribed and one bar was scribed prior to testing. The last set of test bars was coated with a pure Al coating using the DVD process to represent an alternative to cadmium. For the DVD coated set, two bars were scribed and three bars were tested in an unscribed condition. The Al coatings were tested both with and without chromate conversion.

Figure 12B:
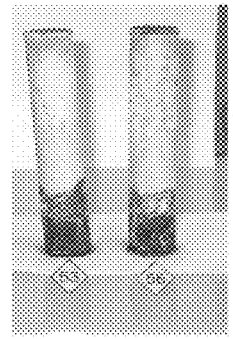
FIG. 12B is an image of two test bars coated with Al using the DVD process following 504 hours in test showing the significant resistance to corrosion.

The results demonstrate that DVD Aluminum coatings have passed a B-117 Salt Fog test by surviving for 504 hours in the corrosion environment, as visible in FIG. 12B. Coatings passed SAE-AMS-QQ-P-416 cadmium specification (96 hours w/no evidence of red rust) and MIL-C-83488 IVD Al for Types II Classes 2 (336 hr) and 3 (504 hr).

The corrosion resistance of the DVD deposited Al coated 300M steel alloy test bars without chromate conversion meets or exceeds the minimum performance requirements for electrodeposited cadmium conforming to SAE AMS QQ-P-460, Type I, Classes 1 and 2. Additionally, the DVTI corrosion coating meets the minimum performance requirements for ion vapor deposited aluminum (IVD-Al) MIL-C-83488 for Type I, Class 3 coatings.

When compared to cadmium, the testing conducted in the ASTM B117 environment showed that the DVD deposited Al coating was slightly less effective at galvanically protecting the underlying high-strength steel substrate. This conclusion is based on visible comparison of the first incidence of red rust on the coated 300M steel test bars in the scribed regions.

Testing confirmed that the inherent corrosion resistance of the DVD deposited Al coating is supplemented by a chromate treatment.

Figure 13A:
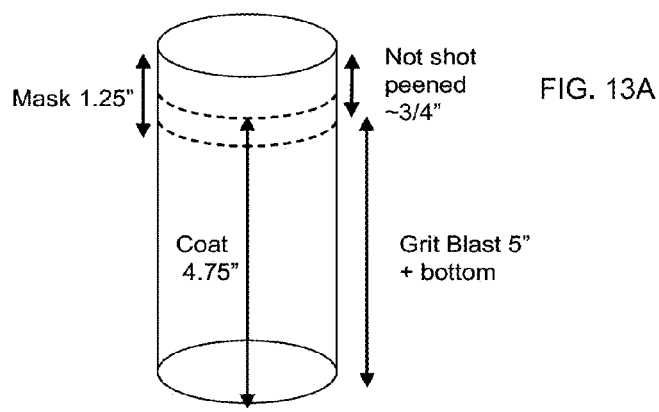
FIG. 13A illustrates a corrosion specimen configuration.

Deposition of Aluminum and Aluminum Alloy Coatings onto Non Line-of-Sight Areas: The DVD approach has been used to deposit both pure aluminum and aluminum alloy coatings onto 300M steel substrates for corrosion resistance measurement. This work has included the deposition of pure aluminum coatings onto steel bars held in a non line-of-sight configuration within the DVD coater to demonstrate the ability to effectively coat the internal regions of tubular substrates using this approach. FIG. 13A illustrates a corrosion specimen configuration. By contrast, FIG. 13B illustrates a steel bar coated with Al using the NLOS multi-bar heating and manipulation apparition of FIG. 13C.

Figure 13B:
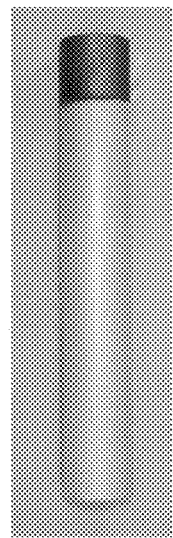
FIG. 13B is a steel bar coated with Al using non line-of-sight multi-bar heating and manipulation apparatus.
Figure 13C:
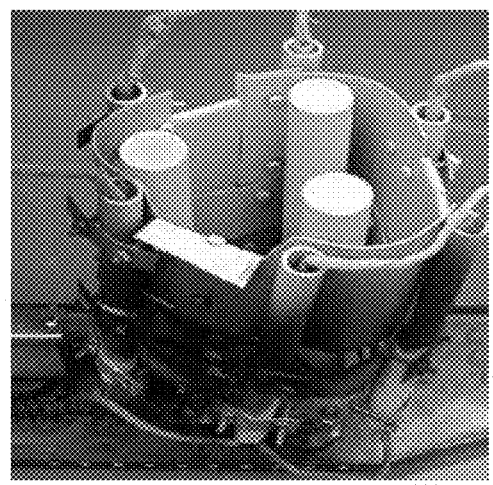
FIG. 13C is an image showing the non line-of-sight multi-bar heating and manipulation apparatus.
Figure 14A:
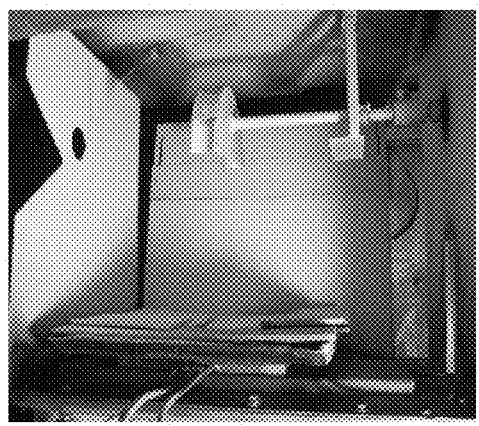
FIGS. 14A-14C are images of mock-up component before and after coating, FIG. 14A mock-up component in the chamber, FIG. 14B mock-up component with reference strips before coating, and FIG. 14C mock-up component after coating.
Figure 14B:
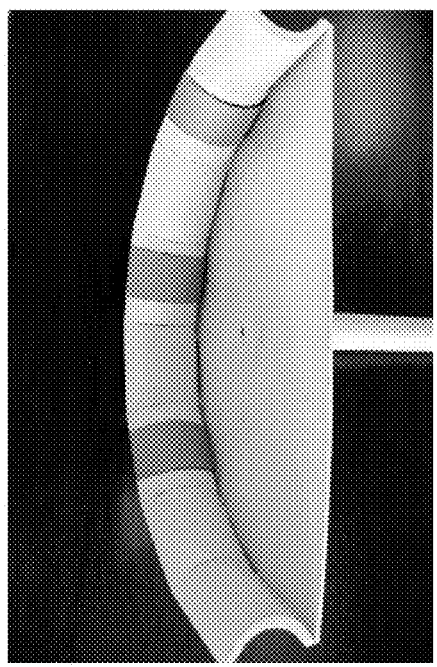
Figure 14C:
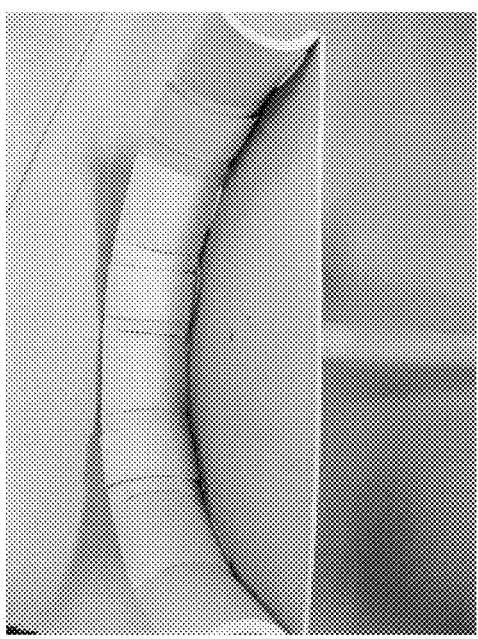

The NLOS deposition is also equally applicable to larger components and not just the bar of FIG. 13B. Larger components with both line-of-sight and non line-of-sight regions can be coated using the directed vapor deposition technique. The concept as shown in FIGS. 14A-C. FIG. 14A is an image of a mock-up component in a NLOS DVD chamber. FIG. 14B shows the mock-up component prior to deposition with reference strips. FIG. 14C shows the deposition completed on the mock-up component, including the deposition visible on the mock-up components, as well as all other regions. The mock-up component, in this embodiment, being for illustration and exemplary purposes only, is to use sections of pipe cut in half welded together to achieve dual curving surfaces of the cable groove region of a tailhook hookpoint.

Therefore, the deposition operates for the placement of aluminum or aluminum alloy on steel. The present technique overcomes the shortcomings of the previous techniques, including the elimination any toxic elements and the generation of toxic by-products. The coating technique is environmentally friendly and provides a significant improvement over the prior coating techniques.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for non-line-of-sight deposition, the method comprising:
providing one of: a steel substrate, an aluminum substrate, an aluminum alloy substrate, a titanium substrate, a titanium alloy substrate, a copper beryllium substrate, an iron substrate, a nickel substrate, and a nickel alloy substrate within a deposition chamber;
   evaporating an aluminum source comprising an aluminum alloy above Al-0.1% Mn to Al-50% Mn by weight, the evaporating generating a plurality of aluminum vapor molecules inside the deposition chamber, wherein the evaporating of the aluminum source does not generate any toxic materials;
   inserting an inert gas into the deposition chamber concurrent with the evaporation of the aluminum vapor molecules; and
   depositing the aluminum on to the substrate, including deposition onto non-line-of-sight regions of the substrate, providing corrosion protection on the substrate in a completely nontoxic operation.

2. The method of claim 1 further comprising:
   using plasma-activation, ionizing the plurality of aluminum vapor molecules to create charged vapor molecules.

3. The method of claim 1 further comprising:
   adjusting at least one of: an inert gas flow rate, an inert gas type, a pressure ratio, a deposition chamber pressure, and a spray nozzle geometry; and
   adjusting a focus of the deposition, including adjusting the location of a deposition focus region for non-line-of-sight deposition.

4. The method of claim 1, wherein the aluminum source is a pure aluminum.

5. The method of claim 1, wherein the aluminum alloy includes a combination of aluminum and manganese Al-3.0% Mn to Al-47% Mn by weight.

6. The method of claim 1, wherein the aluminum alloy includes a combination of aluminum and manganese Al-7.0% Mn to Al-25% Mn by weight.

* * * * *